United States Patent
Wada et al.

(10) Patent No.: US 10,229,836 B2
(45) Date of Patent: Mar. 12, 2019

(54) METHOD FOR MANUFACTURING SILICON CARBIDE EPITAXIAL SUBSTRATE, SILICON CARBIDE EPITAXIAL SUBSTRATE, METHOD FOR MANUFACTURING SILICON CARBIDE SEMICONDUCTOR DEVICE, AND SILICON CARBIDE SEMICONDUCTOR DEVICE

(71) Applicant: Sumitomo Electric Industries, Ltd., Osaka-shi (JP)

(72) Inventors: Keiji Wada, Itami (JP); Taro Nishiguchi, Itami (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/567,443

(22) PCT Filed: Apr. 6, 2016

(86) PCT No.: PCT/JP2016/061212
§ 371 (c)(1),
(2) Date: Oct. 18, 2017

(87) PCT Pub. No.: WO2016/185819
PCT Pub. Date: Nov. 24, 2016

(65) Prior Publication Data
US 2018/0096854 A1      Apr. 5, 2018

(30) Foreign Application Priority Data
May 18, 2015   (JP) ................... 2015-101018

(51) Int. Cl.
*C23C 16/32*   (2006.01)
*C30B 29/36*   (2006.01)
(Continued)

(52) U.S. Cl.
CPC ...... *H01L 21/30625* (2013.01); *C23C 16/325* (2013.01); *C23C 16/56* (2013.01);
(Continued)

(58) Field of Classification Search
CPC ....... C23C 16/325; C23C 16/56; C30B 29/36; C30B 25/20; C30B 25/36;
(Continued)

(56) References Cited

U.S. PATENT DOCUMENTS 5,279,701 A    1/1994  Shigeta et al.
7,772,058 B2 *  8/2010  Tanimoto ............ H01L 21/0485
                                                    438/197
(Continued)

FOREIGN PATENT DOCUMENTS

JP   H01-286997 A    11/1989
JP   2005-508086 A    3/2005
(Continued)

OTHER PUBLICATIONS

Non-Final Office Action issued in U.S. Appl. No. 15/114,017 dated Dec. 15, 2016.
(Continued)

*Primary Examiner* — Eric A. Ward
(74) *Attorney, Agent, or Firm* — Venable LLP; Michael A. Sartori; Laura G. Remus

(57) ABSTRACT

A method for manufacturing a silicon carbide epitaxial substrate includes epitaxially growing a first layer on a silicon carbide single crystal substrate, and forming a second layer at an outermost surface of the first layer. The second layer has a chemical composition or density different from that of the first layer. A ratio of a thickness of the second layer to a thickness of the first layer is more than 0% and less than or equal to 10%.

6 Claims, 14 Drawing Sheets

(51) Int. Cl.
*H01L 29/16* (2006.01)
*H01L 21/306* (2006.01)
*C30B 25/20* (2006.01)
*H01L 21/02* (2006.01)
*H01L 29/34* (2006.01)
*H01L 29/40* (2006.01)
*H01L 29/78* (2006.01)
*C23C 16/56* (2006.01)
*H01L 29/66* (2006.01)
*H01L 29/739* (2006.01)
*H01L 29/04* (2006.01)
*C30B 25/02* (2006.01)

(52) U.S. Cl.
CPC ............. *C30B 25/02* (2013.01); *C30B 25/20* (2013.01); *C30B 29/36* (2013.01); *H01L 21/0262* (2013.01); *H01L 21/02164* (2013.01); *H01L 21/02378* (2013.01); *H01L 21/02433* (2013.01); *H01L 21/02447* (2013.01); *H01L 21/02529* (2013.01); *H01L 21/02634* (2013.01); *H01L 29/045* (2013.01); *H01L 29/1608* (2013.01); *H01L 29/34* (2013.01); *H01L 29/408* (2013.01); *H01L 29/66068* (2013.01); *H01L 29/7395* (2013.01); *H01L 29/7802* (2013.01); *H01L 21/02664* (2013.01)

(58) Field of Classification Search
CPC ......... H01L 21/02164; H01L 21/02378; H01L 21/02529; H01L 21/02634; H01L 21/30625; H01L 21/02433; H01L 21/02447; H01L 21/0262; H01L 21/02664; H01L 21/20; H01L 21/205; H01L 21/304; H01L 29/045; H01L 29/12; H01L 29/66068; H01L 29/739; H01L 29/7395; H01L 29/78; H01L 59/1608
See application file for complete search history.

(56) References Cited

U.S. PATENT DOCUMENTS

| | | | |
|---|---|---|---|
| 8,222,648 B2* | 7/2012 | Tanimoto | H01L 21/049 257/77 |
| 8,609,513 B2 | 12/2013 | Horii | |
| 2014/0252378 A1* | 9/2014 | Ota | H01L 29/78 257/77 |
| 2016/0351667 A1 | 12/2016 | Wada et al. | |
| 2016/0355949 A1 | 12/2016 | Wada et al. | |
| 2017/0037538 A1* | 2/2017 | Masumoto | C30B 29/36 |
| 2018/0016706 A1* | 1/2018 | Norimatsu | C30B 29/36 |

FOREIGN PATENT DOCUMENTS

| | | |
|---|---|---|
| JP | 2006-313850 A | 11/2006 |
| JP | 2007-066944 A | 3/2007 |
| JP | 2008-235331 A | 10/2008 |
| JP | 2009-256138 A | 11/2009 |
| JP | 2010-095431 A | 4/2010 |
| JP | 2012-199384 A | 10/2012 |
| JP | 2013-034007 A | 2/2013 |
| WO | 03/038876 A1 | 5/2003 |
| WO | 2016/031439 A1 | 3/2016 |

OTHER PUBLICATIONS

Final Office Action issued in U.S. Appl. No. 15/114,017 dated Apr. 10, 2017.
Notice of Allowance issued in U.S. Appl. No. 15/114,017 dated Jun. 26, 2017.
International Search Report in International Application No. PCT/JP2015/064585, dated Aug. 25, 2015.
Notice of Grounds of Rejection in Japanese Patent Application No. 2015-554915, dated Dec. 15, 2015.
Notice of Grounds of Rejection in Japanese Patent Application No. 2015-554915, dated Feb. 9, 2016.
Ishiyama et al., "Gate oxide reliability on trapezoid-shaped defects and obtuse triangular defects in 4H-SiC epitaxial wafers," Japanese Journal of Applied Physics 53, Mar. 25, 2014.
Kitabatake, "Comprehensive Evaluation Platform for SiC Single Crystal Wafers," Engineering Materials, vol. 62, No. 3, Mar. 2014.
Decision to Grant Patent in Japanese Patent Application No. 2015-554915, dated May 24, 2016.

* cited by examiner

METHOD FOR MANUFACTURING SILICON CARBIDE EPITAXIAL SUBSTRATE, SILICON CARBIDE EPITAXIAL SUBSTRATE, METHOD FOR MANUFACTURING SILICON CARBIDE SEMICONDUCTOR DEVICE, AND SILICON CARBIDE SEMICONDUCTOR DEVICE

TECHNICAL FIELD

The present disclosure relates to a method for manufacturing a silicon carbide epitaxial substrate, a silicon carbide epitaxial substrate, a method for manufacturing a silicon carbide semiconductor device, and a silicon carbide semiconductor device.

BACKGROUND ART

Japanese Patent Laying-Open No. 2013-34007 (PTD 1) discloses a silicon carbide epitaxial substrate characterized by having no short step bunching.

CITATION LIST

Patent Document

PTD 1: Japanese Patent Laying-Open No. 2013-34007

SUMMARY OF INVENTION

Technical Problem

An object of the present disclosure is to shorten a takt time in the step of polishing a surface of a silicon carbide epitaxial substrate, by chemical mechanical polishing (CMP).

Solution to Problem

A method for manufacturing a silicon carbide epitaxial substrate in accordance with one aspect of the present disclosure includes epitaxially growing a first layer on a silicon carbide single crystal substrate, and forming a second layer at an outermost surface of the first layer, the second layer having a chemical composition or density different from that of the first layer. A ratio of a thickness of the second layer to a thickness of the first layer is more than 0% and less than or equal to 10%.

A silicon carbide epitaxial substrate in accordance with one aspect of the present disclosure includes a silicon carbide single crystal substrate, a first layer which is an epitaxial layer formed on the silicon carbide single crystal substrate, and a second layer formed at an outermost surface of the first layer. The second layer has a chemical composition or density different from that of the first layer. A ratio of a thickness of the second layer to a thickness of the first layer is more than 0% and less than or equal to 10%.

A silicon carbide epitaxial substrate in accordance with one aspect of the present disclosure includes a silicon carbide single crystal substrate, and an epitaxial layer formed on the silicon carbide single crystal substrate. An arithmetic average roughness in a surface of the epitaxial layer is less than or equal to 0.1 nm. In the surface of the epitaxial layer, carrot defects have a defect density of less than or equal to $0.1/cm^2$, and trapezoidal defects, which are trapezoidal depressions, have a defect density of less than or equal to $0.1/cm^2$. The trapezoidal defects each include an upper base portion and a lower base portion intersecting with a <11-20> direction when viewed in plan view. The upper base portion has a width of more than or equal to 0.1 μm and less than or equal to 100 μm. The lower base portion has a width of more than or equal to 50 μm and less than or equal to 5000 μm. The upper base portion includes a protruding portion. The lower base portion includes a plurality of step bunchings.

A silicon carbide semiconductor device in accordance with one aspect of the present disclosure includes a silicon carbide epitaxial substrate including a silicon carbide single crystal substrate and an epitaxial layer, the silicon carbide single crystal substrate having a first main surface and a second main surface located opposite to the first main surface, the epitaxial layer being formed on the first main surface and having a third main surface opposite to a side on which the silicon carbide single crystal substrate is located. The silicon carbide semiconductor device further includes a silicon oxide film formed on the third main surface, a first electrode connected to a third main surface side, and a second electrode connected to a second main surface side. A thickness of the silicon oxide film is more than or equal to 10 nm and less than or equal to 100 nm. A charge-to-breakdown in time-dependent dielectric breakdown measurement performed in an environment at 25° C. and at a constant current density of 20 $mA/cm^2$ is more than or equal to 60 $C/cm^2$.

Advantageous Effects of Invention

According to the above description, the takt time in the step of polishing the surface of the silicon carbide epitaxial substrate can be shortened by CMP.

DESCRIPTION OF EMBODIMENTS

[Description of Embodiment of Present Disclosure]

Figure 1:
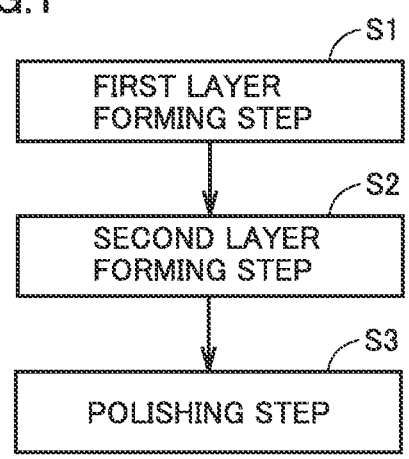
FIG. 1 is a flowchart schematically showing a method for manufacturing a silicon carbide epitaxial substrate in accordance with one aspect of the present disclosure.

First, an embodiment of the present disclosure will be described in list form. In the description below, identical or corresponding elements will be designated by the same reference numerals, and the same description thereof will not be repeated. Further, regarding crystallographic indications in the present specification, an individual orientation is represented by [ ], a group orientation is represented by < >, an individual plane is represented by ( ), and a group plane is represented by { }. Generally, a negative index is supposed to be crystallographically indicated by putting "-" (bar) above a numeral, but is indicated by putting the negative sign before the numeral in the present specification. In addition, "plan view" refers to a field of view when a surface of an epitaxial layer is viewed in a direction of a normal thereto.

[1] A method for manufacturing a silicon carbide epitaxial substrate in accordance with one aspect of the present disclosure includes epitaxially growing a first layer on a silicon carbide single crystal substrate, and forming a second layer at an outermost surface of the first layer, the second layer having a chemical composition or density different from that of the first layer. A ratio of a thickness of the second layer to a thickness of the first layer is more than 0% and less than or equal to 10%.

It is considered that, in a silicon carbide semiconductor device, the life and reliability of a silicon oxide film are influenced by surface properties of a silicon carbide epitaxial substrate below the silicon oxide film. For example, when a silicon oxide film is formed on a surface including a large step bunching, the silicon oxide film may have variations in thickness. In addition, when a silicon oxide film is formed over surface defects such as carrot defects, the film quality of the silicon oxide film may change. When the silicon oxide film has variations in thickness and film quality, local electric field concentration is likely to occur, and the life and reliability of the silicon oxide film may be decreased.

Therefore, an attempt has been made to improve the surface properties by CMP before forming the silicon oxide film. However, since silicon carbide (SiC) has a high hardness and is difficult to polish, it takes a long time to polish the silicon carbide epitaxial substrate by the CMP. Furthermore, even after the CMP is performed, minute unevenness, surface defects, and the like may remain in the surface of the silicon carbide epitaxial substrate.

Accordingly, in the manufacturing method described above in [1], the second layer which can be easily polished by the CMP is formed at the outermost surface of the first layer. The second layer has a chemical composition or density different from that of the first layer.

The first layer is a homoepitaxial layer grown on the silicon carbide single crystal substrate. The composition ratio of carbon and silicon in the first layer may be considered as substantially 1:1. For example, the second layer is set to have a composition deviated from this stoichiometric ratio. Thereby, the second layer is considered to have a hardness lower than that of the first layer, that is, silicon carbide, and to be easily polished by the CMP. Alternatively, the second layer may be a layer having a density different from that of the first layer. Namely, by forming the second layer to have a loose or dense crystal structure when compared with the first layer, the second layer is considered to be easily polished by the CMP.

The ratio of the thickness of the second layer to the thickness of the first layer is set to more than 0% and less than or equal to 10%. When the ratio is more than 10%, the effect of shortening a takt time may be decreased.

In [1] described above, the second layer may be grown on the first layer, or may be formed by altering a portion of the first layer.

[2] In [1] described above, a composition ratio of silicon in the second layer may be higher than a composition ratio of silicon in the first layer.

[3] In [1] described above, a composition ratio of carbon in the second layer may be higher than a composition ratio of carbon in the first layer.

[4] In [1] described above, the density of the second layer may be lower than the density of the first layer.

[5] In [1] described above, the second layer may contain an element serving as a catalyst for a chemical reaction in CMP.

[6] The manufacturing method described above may further include polishing the second layer by CMP.

[7] A silicon carbide epitaxial substrate in accordance with one aspect of the present disclosure includes a silicon carbide single crystal substrate, a first layer which is an epitaxial layer formed on the silicon carbide single crystal substrate, and a second layer formed at an outermost surface of the first layer. The second layer has a chemical composition or density different from that of the first layer. A ratio of a thickness of the second layer to a thickness of the first layer is more than 0% and less than or equal to 10%.

In the silicon carbide epitaxial substrate including the second layer, it is expected that the takt time in the CMP will be shortened or a process window will be widened. It is also expected that performing the CMP on this silicon carbide epitaxial substrate may decrease conventionally remaining minute unevenness, surface defects, and the like.

[8] A silicon carbide epitaxial substrate in accordance with one aspect of the present disclosure includes a silicon carbide single crystal substrate, and an epitaxial layer formed on the silicon carbide single crystal substrate. An arithmetic average roughness in a surface of the epitaxial layer is less than or equal to 0.1 nm. In the surface of the epitaxial layer, carrot defects have a defect density of less than or equal to $0.1/cm^2$, and trapezoidal defects, which are trapezoidal depressions, have a defect density of less than or equal to $0.1/cm^2$. The trapezoidal defects each include an upper base portion and a lower base portion intersecting with a <11-20> direction when viewed in plan view. The upper base portion has a width of more than or equal to 0.1 μm and less than or equal to 100 μm, and the lower base portion has a width of more than or equal to 50 μm and less than or equal to 5000 μm. The upper base portion includes a protruding portion. The lower base portion includes a plurality of step bunchings.

In the silicon carbide semiconductor device manufactured using the silicon carbide epitaxial substrate having the above surface properties, improvement in the life and reliability of the silicon oxide film is expected.

Here, the arithmetic average roughness indicates an arithmetic average roughness (Ra) measured in conformity with "JIS B 0601". The arithmetic average roughness is measured using an AFM (Atomic Force Microscope). As the AFM, for example, "Dimension 3000" manufactured by Veeco or the like can be used. As a cantilever (probe), for example, "NCHV-10V" manufactured by Bruker is suitable. AFM conditions are as follows. The measurement mode of the AFM is set to a tapping mode. The measurement region in the tapping mode is set to a square having each side of 10 μm. The measurement pitch is set to 40 nm. The measurement depth is set to 1.0 μm. The scanning speed within the measurement region is set to 5 seconds for one cycle. The number of data for each scan line is set to 512 points. The number of the scan lines is set to 512. Displacement control for the cantilever is set to 15.50 nm.

The defect densities of carrot defects and trapezoidal defects can be calculated by analyzing the entire surface of the epitaxial layer at a magnification of 50 times to 400 times using a Nomarski-type optical microscope (for example, "MX-51" manufactured by Olympus Corporation), and dividing the number of each type of the detected defects by the area of the surface of the epitaxial layer. It should be noted that generally the entire surface used herein does not include a region which is not utilized for a semiconductor device. Here, the region which is not utilized for a semiconductor device refers to, for example, a region of 3 mm from edges of a substrate.

[9] A method for manufacturing a silicon carbide semiconductor device in accordance with one aspect of the present disclosure includes preparing the silicon carbide epitaxial substrate described above in [8], and forming a silicon oxide film on the epitaxial layer.

[10] A silicon carbide semiconductor device in accordance with one aspect of the present disclosure includes a silicon carbide epitaxial substrate including a silicon carbide single crystal substrate and an epitaxial layer, the silicon carbide single crystal substrate having a first main surface and a second main surface located opposite to the first main surface, the epitaxial layer being formed on the first main surface and having a third main surface opposite to a side on which the silicon carbide single crystal substrate is located. The silicon carbide semiconductor device further includes a silicon oxide film formed on the third main surface, a first electrode connected to a third main surface side, and a second electrode connected to a second main surface side. A thickness of the silicon oxide film is more than or equal to 10 nm and less than or equal to 100 nm. A charge-to-breakdown in time-dependent dielectric breakdown measurement performed in an environment at 25° C. and at a constant current density of 20 mA/cm$^2$ is more than or equal to 60 C/cm$^2$.

Hereinafter, time-dependent dielectric breakdown measurement performed at a constant current density as described above is also referred to as "constant current TDDB (Time Dependent Dielectric Breakdown)". A charge-to-breakdown (hereinafter referred to as a "$Q_{BD}$") measured by the constant current TDDB is an indicator of the life and reliability of the silicon oxide film. In the silicon carbide semiconductor device including the silicon carbide epitaxial substrate of the present disclosure, the $Q_{BD}$ can be more than or equal to 60 C/cm$^2$. It should be noted that the environment at 25° C. in [10] described above means setting the measurement environment at 25° C. in a constant-temperature facility subjected to predetermined calibration. Accordingly, the measurement environment may vary about ±2° C. from 25° C. during measurement, depending on the capability of the constant-temperature facility, for example.

[Details of Embodiment of Present Disclosure]

Hereinafter, one embodiment of the present disclosure (hereinafter referred to as the "present embodiment") will be described, although the embodiment of the present disclosure is not limited thereto.

[First Embodiment: Method for Manufacturing Silicon Carbide Epitaxial Substrate]

FIG. 1 is a flowchart schematically showing a method for manufacturing a silicon carbide epitaxial substrate (a first silicon carbide epitaxial substrate 100 and a second silicon carbide epitaxial substrate 101) in accordance with the present embodiment. As shown in FIG. 1, the manufacturing method includes a first layer forming step (S1) and a second layer forming step (S2). The manufacturing method may further include a polishing step (S3) after the second layer forming step (S2). Each step will be described below.

[First Layer Forming Step (S1)]

Figure 2:
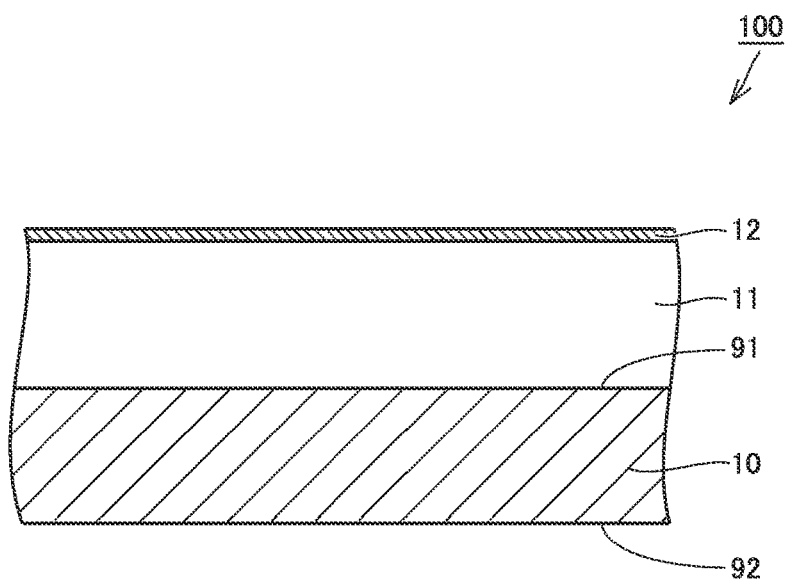
FIG. 2 is a schematic cross sectional view illustrating a first layer forming step and a second layer forming step.

FIG. 2 is a schematic cross sectional view illustrating the first layer forming step (S1) and the second layer forming step (S2). In the first layer forming step (S1), a first layer 11 is homoepitaxially grown on a silicon carbide single crystal substrate 10. Silicon carbide single crystal substrate 10 is prepared for example by slicing a bulk single crystal of silicon carbide. For slicing, a wire saw can be used, for example. Silicon carbide desirably has a polytype of 4H—SiC. 4H—SiC is more excellent in electron mobility, dielectric strength, and the like than other polytypes. Silicon carbide single crystal substrate 10 may have an n type conductivity type, for example. Silicon carbide single crystal substrate 10 may have a diameter of more than or equal to 100 mm, or more than or equal to 150 mm, and less than or equal to 300 mm.

Silicon carbide single crystal substrate 10 has a first main surface 91 and a second main surface 92 located opposite to first main surface 91. First main surface 91, which will serve as an epitaxial growth surface, is desirably a surface inclined from a (0001) plane or a (000-1) plane by more than or equal to 1° and less than or equal to 8°. The direction of inclination is desirably a <11-20> direction. The inclined angle (off angle) may be more than or equal to 2° and less than or equal to 7°, more than or equal to 3° and less than or equal to 6°, or more than or equal to 3° and less than or equal to 5°.

Figure 3:
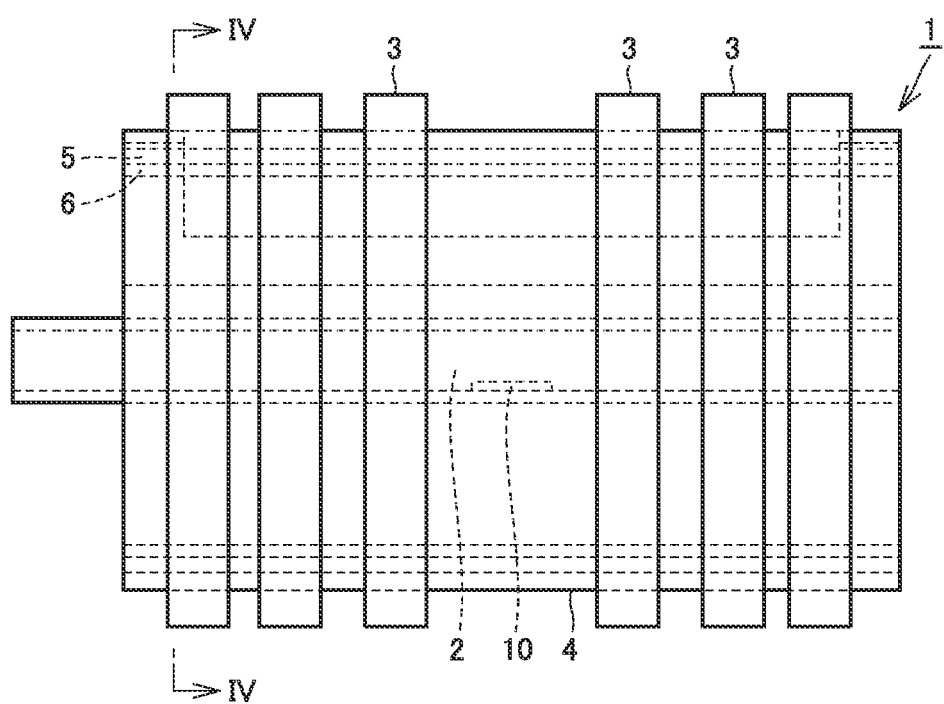
FIG. 3 is a schematic side view showing an example of a film forming device.
Figure 4:
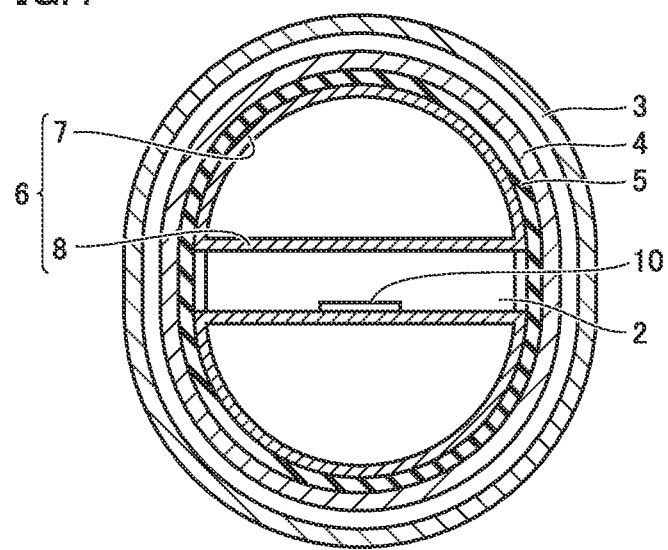
FIG. 4 is a schematic cross sectional view taken along a line IV-IV in FIG. 3.

In the first layer forming step (S1), first layer 11 is homoepitaxially grown by a CVD (Chemical Vapor Deposition) method. FIG. 3 is a schematic side view showing an example of a film forming device 1. FIG. 4 is a schematic cross sectional view taken along a line IV-IV in FIG. 3. Film forming device 1 is a lateral hot-wall CVD device. As shown in FIGS. 3 and 4, film forming device 1 includes heating elements 6, a heat insulator 5, a quartz tube 4, and an induction heating coil 3. Heating elements 6 are made of graphite, for example. As shown in FIG. 4, film forming device 1 is provided with two heating elements 6, and each heating element 6 has a semi-cylindrical hollow structure including a curved portion 7 and a flat portion 8. Two flat portions 8 are arranged to face each other, and a space surrounded by two flat portions 8 serves as a chamber 2 in which silicon carbide single crystal substrate 10 is to be placed.

First layer 11 is grown, for example, under the following conditions. The temperature within chamber 2 may be about 1500° C. to 1700° C., for example. The carrier gas may be hydrogen ($H_2$) gas, for example. The flow rate of the hydrogen gas may be about 50 slm to 200 slm, for example. The unit "slm (Standard Liter per Minute)" of the flow rate represents "L/min" in a standard state (0° C., 101.3 kPa). The pressure in chamber 2 may be about 5 to 15 kPa, for example.

The source gas includes, for example, a Si source gas such as silane ($SiH_4$) gas, and a C source gas such as propane ($C_3H_8$) gas or acetylene ($C_2H_2$) gas. The C/Si ratio in the source gas may be about 0.9 to 1.3, for example. Here, the "C/Si ratio" represents the ratio of the number of C atoms to the number of Si atoms in the source gas.

The dopant gas includes, for example, ammonia ($NH_3$) gas, nitrogen ($N_2$) gas, or the like. The flow rate of the dopant gas may be adjusted such that first layer 11 has an impurity concentration of more than or equal to $1\times10^{14}$ cm$^{-3}$ and less than or equal to $2\times10^{16}$ cm$^{-3}$, for example.

The thickness of first layer 11 can be changed as appropriate. The lower limit of the thickness of first layer 11 may be 5 μm, 10 μm, or 20 μm, for example. The upper limit of the thickness of first layer 11 may be 100 μm, 75 μm, or 50 μm.

[Second Layer Forming Step (S2)]

In the second layer forming step (S2), a second layer 12 having a chemical composition or density different from that of first layer 11 is formed at an outermost surface of first layer 11. Second layer 12 may be epitaxially grown on the surface of first layer 11, or may be formed by altering a portion of first layer 11.

Second layer 12 is a layer which can be easily polished by CMP when compared with first layer 11. The ratio of the thickness of second layer 12 to the thickness of first layer 11 is set to more than 0% and less than or equal to 10%. The ratio indicates a percentage of the value obtained by dividing the thickness of second layer 12 by the thickness of first layer 11. The lower limit of the ratio may be 0.1% or 1%. The upper limit of the ratio may be 8%, 5%, or 3%. Within these ranges, it is expected that the takt time in the CMP will be shortened or the process window will be expanded. The thickness of second layer 12 may be more than or equal to 0.1 μm and less than or equal to 1.0 μm, or more than or equal to 0.1 μm and less than or equal to 0.5 μm, for example.

Second layer 12 is formed, for example, under the following conditions. After first layer 11 of a predetermined thickness is grown, supply of the Si source gas among the source gas is stopped. Supply of the C source gas and the $H_2$ gas serving as the carrier gas is continued, and the flow rates of the respective gases are adjusted such that the ratio of the flow rate of the C source gas to the flow rate of the carrier gas is set to more than or equal to 0.05% and less than or equal to 0.10%, for example. The pressure within chamber 2 is adjusted to less than or equal to 8 kPa. It is desirable to adjust the pressure within 10 seconds. Further, the substrate temperature is increased by about 20 to 40° C.

By performing these operations, second layer 12 having a composition ratio of carbon higher than that of first layer 11 is formed. Second layer 12 having a composition deviated from a stoichiometric ratio as described above is softer than silicon carbide, and is expected to be easily polished by the CMP. Further, since carbon is more reactive than silicon carbide, it is expected that a chemical action in the CMP will be promoted by increasing the composition ratio of carbon in second layer 12. It is also expected that configurations of pits, carrot defects, trapezoidal defects, and the like will change with a change in composition. Here, a pit is a surface defect originating from a threading screw dislocation (TSD) which exhibits a substantially circular surface shape when viewed in plan view and has a depth of more than or equal to 8 nm from the surface. The depth of a pit can be measured with an AFM. The aforementioned AFM conditions can be employed as measurement conditions.

Alternatively, in the above description, after first layer 11 of a predetermined thickness is grown, supply of the C source gas among the source gas may be stopped. In this case, the flow rates of the respective gases are adjusted such that the ratio of the flow rate of the Si source gas to the flow rate of the carrier gas is set to more than or equal to 0.05% and less than or equal to 0.10%, for example. The pressure within chamber 2 is adjusted to less than or equal to 8 kPa. It is desirable to adjust the pressure within 10 seconds. Further, the substrate temperature is increased by about 20 to 40° C.

By performing these operations, second layer 12 having a composition ratio of silicon higher than that of first layer 11 is formed. Second layer 12 having a composition deviated from a stoichiometric ratio as described above is softer than silicon carbide, and is expected to be easily polished by the CMP. It is also expected that configurations of pits, carrot defects, trapezoidal defects, and the like will change with a change in composition.

Further, by adopting the composition deviated from the stoichiometric ratio as described above, second layer 12 having a loose crystal structure and having a density lower than that of first layer 11 may be formed. This may also facilitate polishing by the CMP.

Second layer 12 may contain an element serving as a catalyst (catalyst element) for a chemical reaction in the CMP. It is expected that the takt time will be shortened as the catalyst element promotes the chemical action in the CMP. Examples of the catalyst element include aluminum (Al), platinum (Pt), palladium (Pd), and the like. That is, second layer 12 may contain at least one selected from the group consisting of Al, Pt, and Pd. For example, it is conceivable to form second layer 12 by implanting aluminum ions into the outermost surface of first layer 11. Alternatively, it is conceivable to introduce trimethylaluminum [$Al(CH_3)_3$] or the like when second layer 12 is epitaxially grown.

[Polishing Step (S3)]

In the polishing step (S3), second layer 12 is polished by the CMP. In the polishing step (S3), second layer 12 may be completely removed, or a portion of second layer 12 may remain. The polishing amount in the polishing step (S3) is preferably substantially equal to the thickness of second layer 12. Abrasive grains for the CMP may be colloidal silica, fumed silica, alumina, or the like, for example. The polishing solution for the CMP may be the one including an oxidizing agent, such as hydrogen peroxide water, for example. By performing the CMP on second layer 12 having a composition and the like suitable for the CMP as described above, there is a possibility to reduce the arithmetic average roughness to less than or equal to 0.1 nm, and also reduce the defect densities. After the CMP, second silicon carbide epitaxial substrate 101 may be cleaned with pure water, an acid, an alkali, or the like.

[Second Embodiment: Silicon Carbide Epitaxial Substrate]

Next, first silicon carbide epitaxial substrate 100 and second silicon carbide epitaxial substrate 101 manufactured by the manufacturing method described above will be described.

[First Silicon Carbide Epitaxial Substrate]

First silicon carbide epitaxial substrate 100 shown in FIG. 2 is a substrate manufactured through the first layer forming step (S1) and the second layer forming step (S2) described above. First silicon carbide epitaxial substrate 100 includes silicon carbide single crystal substrate 10, first layer 11 which is an epitaxial layer formed on silicon carbide single crystal substrate 10, and second layer 12 formed at the outermost surface of first layer 11. Second layer 12 has a chemical composition or density different from that of first layer 11. The ratio of the thickness of second layer 12 to the thickness of first layer 11 is more than 0% and less than or equal to 10%.

Here, the chemical compositions and thicknesses of first layer 11 and second layer 12 can be measured by XPS (X-ray Photoelectron Spectroscopy), AES (Auger Electron Spectroscopy), or the like, for example. The density difference between first layer 11 and second layer 12 can be measured by a photoluminescence method, a Raman spectrometric method, an X ray diffraction method, or the like, for example. As described above, second layer 12 is a layer which can be easily polished by the CMP. By polishing a surface of first silicon carbide epitaxial substrate 100 by the CMP, there is a possibility to manufacture second silicon carbide epitaxial substrate 101 excellent in surface properties.

[Second Silicon Carbide Epitaxial Substrate]

Figure 5:
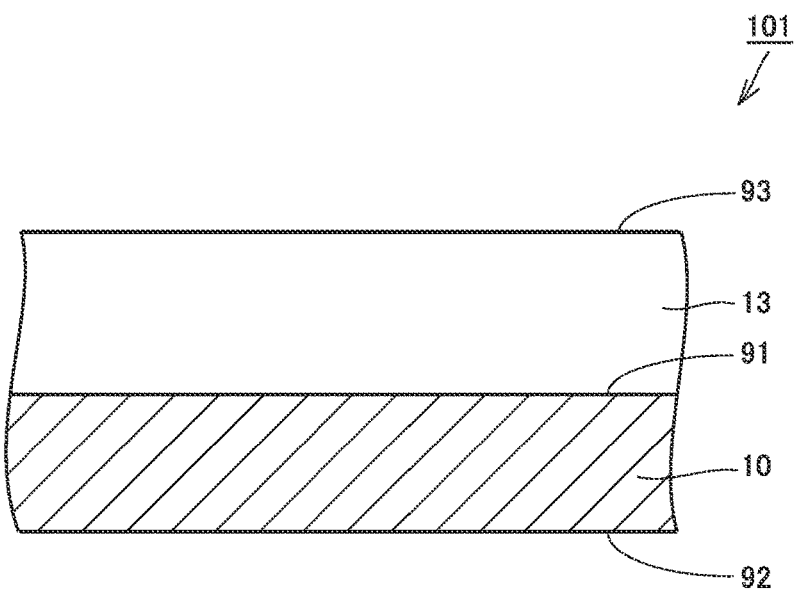
FIG. 5 is a schematic cross sectional view showing an example of a configuration of the silicon carbide epitaxial substrate in accordance with one aspect of the present disclosure.

FIG. 5 is a schematic cross sectional view showing an example of a configuration of second silicon carbide epitaxial substrate 101 in accordance with the present embodiment. Second silicon carbide epitaxial substrate 101 shown in FIG. 5 is a substrate manufactured through the first layer forming step (S1) to the polishing step (S3) described above. Second silicon carbide epitaxial substrate 101 includes silicon carbide single crystal substrate 10, and an epitaxial layer 13 formed on silicon carbide single crystal substrate 10. Here, epitaxial layer 13 corresponds to first layer 11 described above. In second silicon carbide epitaxial substrate 101, second layer 12 described above is substantially removed by the CMP. Second silicon carbide epitaxial substrate 101 has excellent surface properties.

An arithmetic average roughness in a surface of epitaxial layer 13 is less than or equal to 0.1 nm. Thereby, improvement in the life and reliability of a silicon oxide film is expected. The smaller the arithmetic average roughness is, the more it is desirable. The arithmetic average roughness may be less than or equal to 0.08 nm, less than or equal to 0.06 nm, or less than or equal to 0.04 nm. Taking productivity into consideration, the lower limit of the arithmetic average roughness may be 0.01 nm, for example.

In the surface of epitaxial layer 13, carrot defects have a defect density of less than or equal to $0.1/cm^2$. Thereby, improvement in the life and reliability of the silicon oxide film is expected. A carrot defect is one of surface defects mostly originating from a TSD, and exhibits a carrot-like planar shape in the surface of epitaxial layer 13. The lower the defect density of carrot defects is, the more it is desirable, and the defect density of carrot defects is ideally 0 (zero). The defect density of carrot defects may be less than or equal to $0.05/cm^2$, or less than or equal to $0.01/cm^2$.

In the surface of epitaxial layer 13, trapezoidal defects 20 have a defect density of less than or equal to $0.1/cm^2$. Thereby, improvement in the life and reliability of the silicon oxide film is expected. The lower the defect density of trapezoidal defects is, the more it is desirable, and the defect density of trapezoidal defects is ideally 0 (zero). The defect density of trapezoidal defects may be less than or equal to $0.05/cm^2$, or less than or equal to $0.01/cm^2$.

Figure 6:
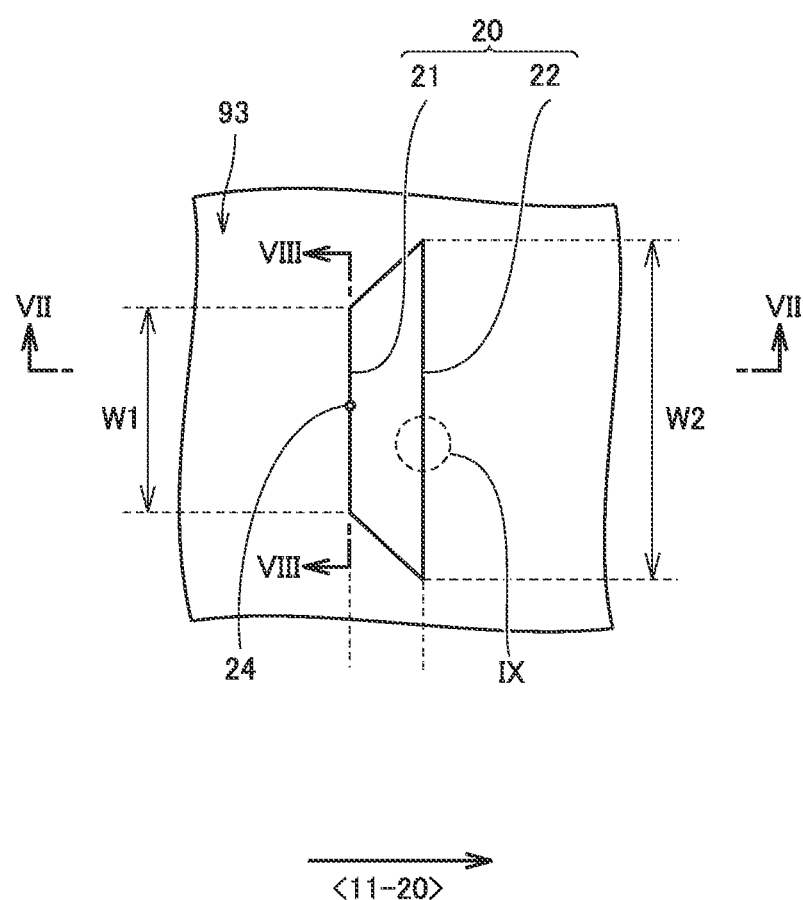
FIG. 6 is a schematic plan view illustrating a trapezoidal defect.

FIG. 6 is a schematic plan view illustrating a trapezoidal defect 20. As shown in FIG. 6, trapezoidal defect 20 is a depression having a trapezoidal planar shape. The trapezoidal defect includes an upper base portion 21 and a lower base portion 22 intersecting with the <11-20> direction. Upper base portion 21 has width (W1) of more than or equal to 0.1 μm and less than or equal to 100 μm, and lower base portion 22 has width (W2) of more than or equal to 50 μm and less than or equal to 5000 μm. The distance between upper base portion 21 and lower base portion 22 (the height of a trapezoid) is more than or equal to 50 μm and less than or equal to 500 μm, for example.

Figure 8:
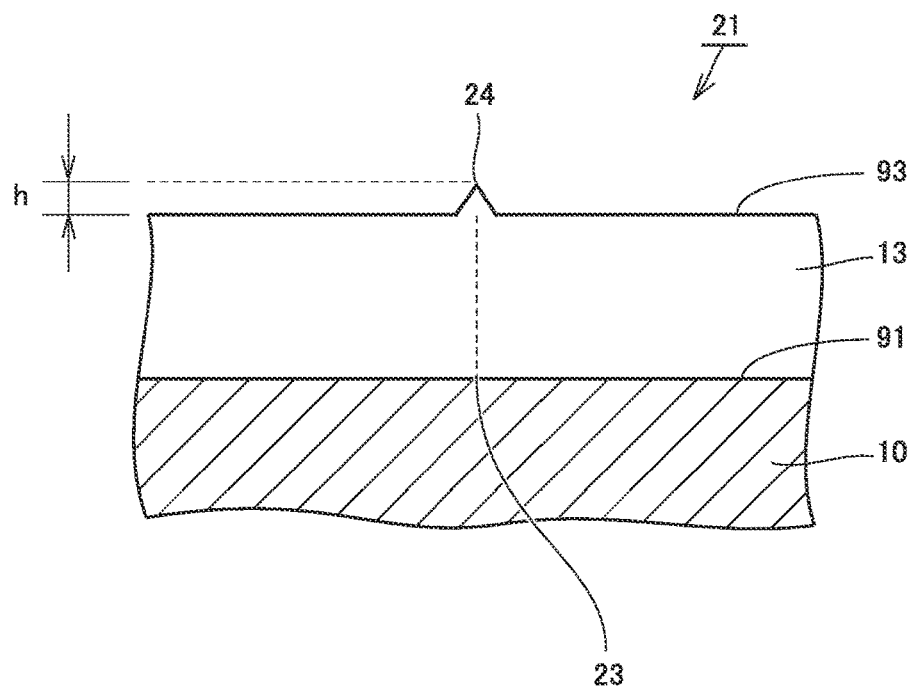
FIG. 8 is a schematic cross sectional view taken along a line VIII-VIII in FIG. 6.

FIG. 8 is a schematic cross sectional view taken along a line VIII-VIII in FIG. 6. As shown in FIG. 8, upper base portion 21 includes a protruding portion 24. Protruding portion 24 may be located substantially at the center of upper base portion 21. In upper base portion 21, protruding portion 24 protrudes about 5 to 20 nm relative to a portion other than protruding portion 24. The height (h) of protruding portion 24 can be measured with a white light interferometric microscope (for example, "BW-D507" manufactured by Nikon Corporation). A mercury lamp is used as a light source. The field of view for measurement is set to 250 μm×250 μm.

Figure 7:
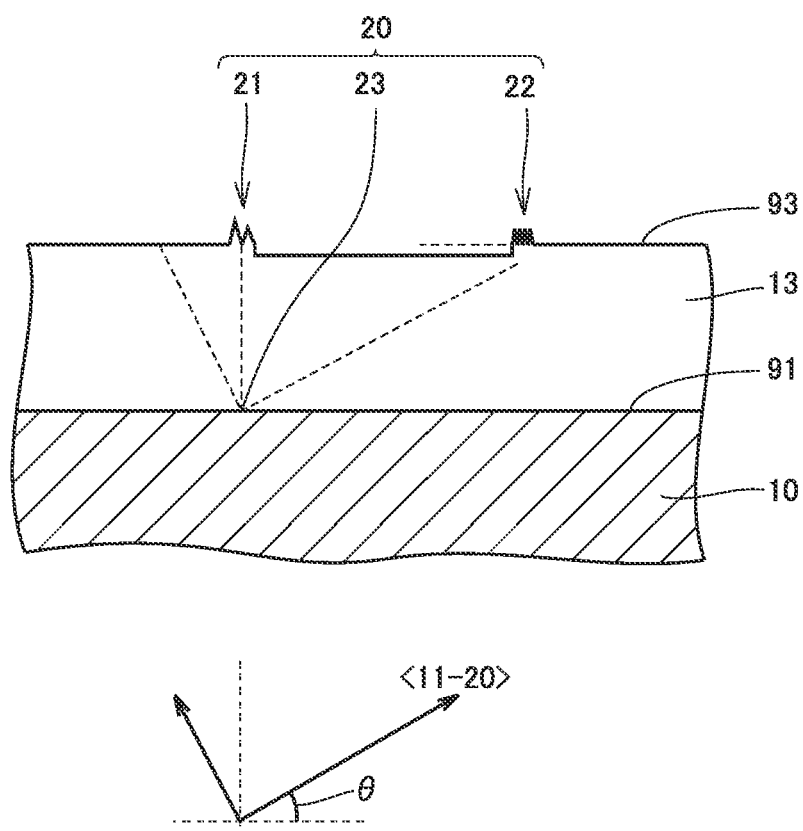
FIG. 7 is a schematic cross sectional view taken along a line VII-VII in FIG. 6.

FIG. 7 is a schematic cross sectional view taken along a line VII-VII in FIG. 6. An angle (θ) in FIG. 7 indicates an off angle. As shown in FIG. 7, inside trapezoidal defect 20, that is, in a region between upper base portion 21 and lower base portion 22, the surface of epitaxial layer 13 slightly recedes toward silicon carbide single crystal substrate 10. Trapezoidal defect 20 has an origin 23 at an interface between silicon carbide single crystal substrate 10 and epitaxial layer 13. Origin 23 may be connected with protruding portion 24. However, protruding portion 24 is not connected with a TSD and a threading edge dislocation (TED).

Figure 9:
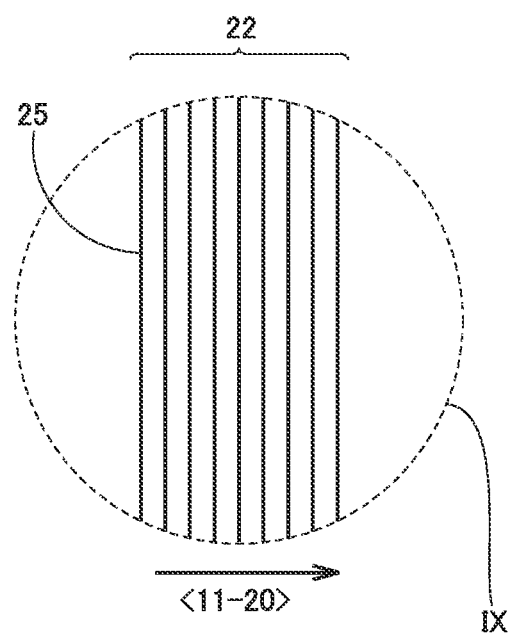
FIG. 9 is an enlarged view of a region IX in FIG. 6.

FIG. 9 is an enlarged view of a region IX in FIG. 6. As shown in FIG. 9, lower base portion 22 includes a plurality of step bunchings 25. The "step bunching" refers to a linear defect in which a plurality of atomic steps form a bunch and produce a level difference of more than or equal to 1 nm. The size of the level difference in the step bunching is about 1 to 5 nm, for example. The size of the level difference in the step bunching can be measured with an AFM, for example. Also in this case, the aforementioned AFM conditions can be employed. The number of the step bunchings included in lower base portion 22 may be, for example, about 2 to 100, or about 2 to 50. The number of the step bunchings included in lower base portion 22 can also be counted by observing lower base portion 22 with the AFM.

[Third Embodiment: Method for Manufacturing Silicon Carbide Semiconductor Device]

A silicon carbide semiconductor device 1000 using second silicon carbide epitaxial substrate 101 described above will now be described. Here, a MOSFET (Metal Oxide Semiconductor Field Effect Transistor) will be described as an example. However, the present embodiment is not limited to a MOSFET. The present embodiment may be applied to an IGBT (Insulated Gate Bipolar Transistor) or the like, for example.

Figure 10:
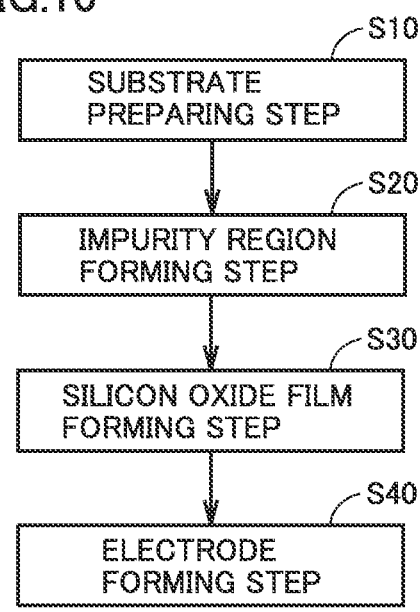
FIG. 10 is a flowchart schematically showing a method for manufacturing a silicon carbide semiconductor device in accordance with one aspect of the present disclosure.

FIG. 10 is a flowchart schematically showing a method for manufacturing silicon carbide semiconductor device 1000 in accordance with the present embodiment. As shown in FIG. 10, the manufacturing method includes a substrate preparing step (S10), an impurity region forming step (S20), a silicon oxide film forming step (S30), and an electrode forming step (S40). Each step will be described below.

[Substrate Preparing Step (S10)]

In the substrate preparing step (S10), second silicon carbide epitaxial substrate 101 is manufactured and prepared by the first layer forming step (S1), the second layer forming step (S2), and the polishing step (S3) described above (see, for example, FIG. 1 and the like).

[Impurity Region Forming Step (S20)]

Figure 11:
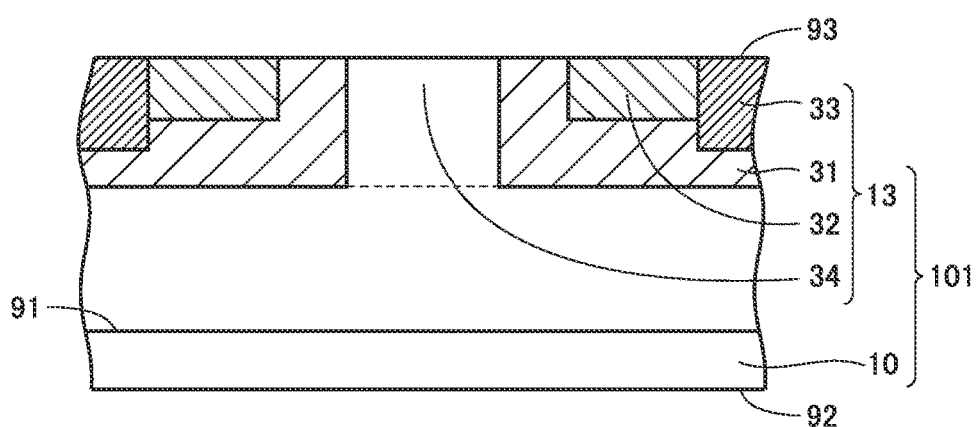
FIG. 11 is a schematic cross sectional view illustrating an impurity region forming step.

FIG. 11 is a schematic cross sectional view illustrating the impurity region forming step (S20). As shown in FIG. 11, second silicon carbide epitaxial substrate 101 includes silicon carbide single crystal substrate 10 and epitaxial layer 13, silicon carbide single crystal substrate 10 having first main surface 91 and second main surface 92 located opposite to first main surface 91, epitaxial layer 13 being formed on first main surface 91 and having a third main surface 93 opposite to a side on which silicon carbide single crystal substrate 10 is located.

In this step, ion implantation is performed on third main surface 93. The ion implantation is performed with second silicon carbide epitaxial substrate 101 being heated to about 300° C. to 600° C. First, a p type impurity such as aluminum, for example, is implanted into a predetermined position in epitaxial layer 13. Thereby, a body region 31 is formed. Next, an n type impurity such as phosphorus (P), for example, is implanted into a predetermined position in body region 31. Thereby, a source region 32 is formed. Next, a p type impurity such as aluminum, for example, is implanted into a predetermined position in source region 32. Thereby, a contact region 33 is formed. A region sandwiched between two body regions 31 serves as a JFET region 34.

Heat treatment is performed after the ion implantation. The heat treatment atmosphere may be an Argon (Ar) atmosphere or the like, for example. The heat treatment temperature may be about 1800° C., for example. The heat treatment time may be about 30 minutes, for example. Thereby, the ion-implanted impurities are activated.

[Silicon Oxide Film Forming Step (S30)]

Figure 12:
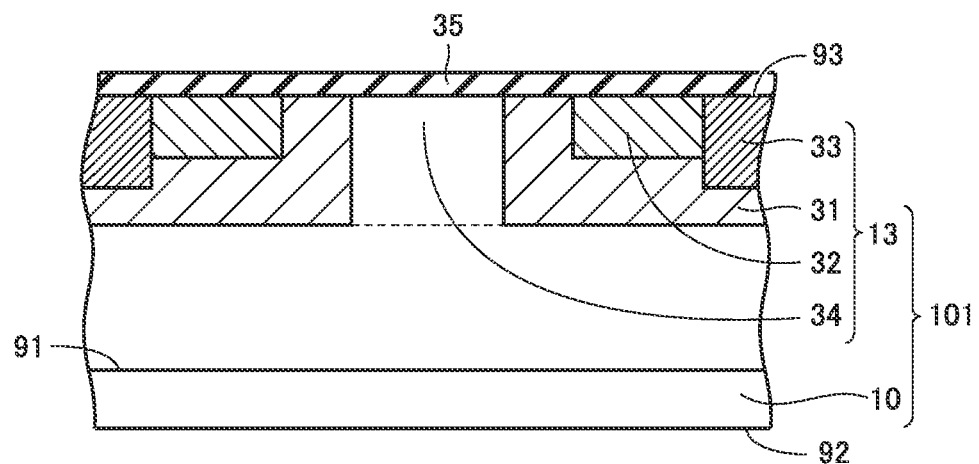
FIG. 12 is a schematic cross sectional view illustrating a silicon oxide film forming step.

FIG. 12 is a schematic cross sectional view illustrating the silicon oxide film forming step (S30). In this step, as shown in FIG. 12, a silicon oxide film 35 is formed on third main surface 93. Silicon oxide film 35 is made of silicon dioxide or the like, for example. Silicon oxide film 35 functions as a gate insulating film. Silicon oxide film 35 may be formed by thermal oxidation, for example. The atmosphere in the thermal oxidation may be an oxygen environment or the like. The heat treatment temperature in the thermal oxidation may be about 1300° C., for example. The heat treatment time in the thermal oxidation may be about 30 minutes, for example.

After silicon oxide film 35 is formed, heat treatment may be further performed in a nitrogen atmosphere. For example, heat treatment may be performed in an atmosphere of nitric oxide (NO), nitrous oxide ($N_2O$), or the like, at about 1100° C., for about one hour. Thereafter, heat treatment may be further performed in an argon atmosphere. For example, heat treatment may be performed in an argon atmosphere, at about 1100 to 1500° C., for about one hour.

[Electrode Forming Step (S40)]

Figure 13:
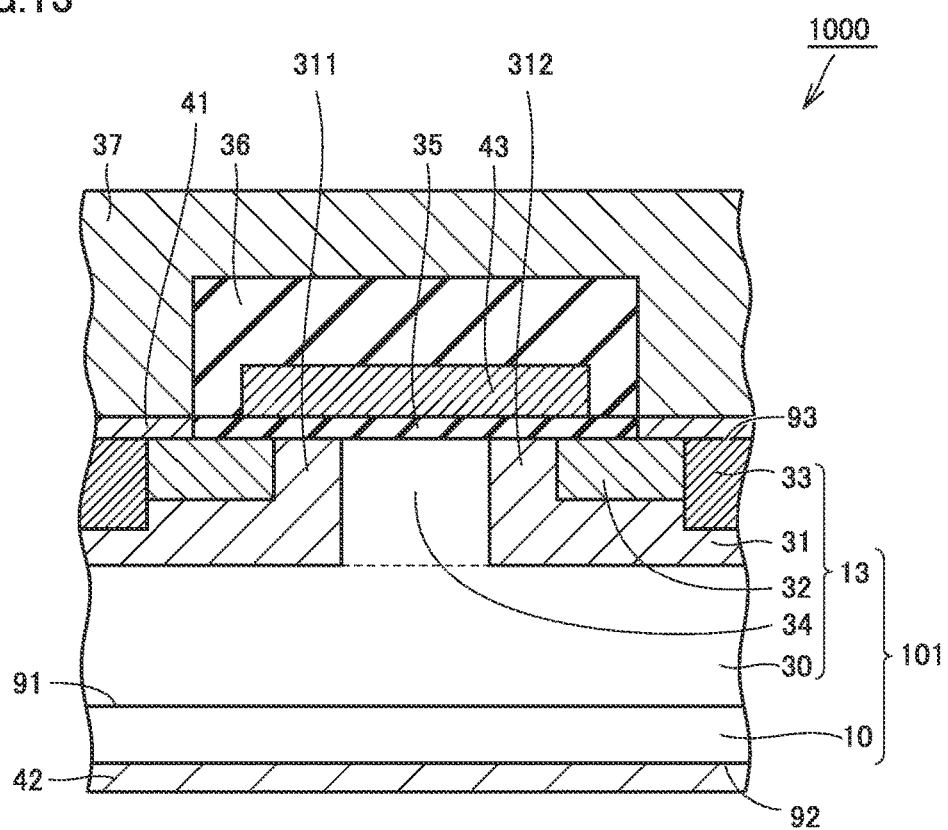
FIG. 13 is a schematic cross sectional view showing an example of a configuration of the silicon carbide semiconductor device in accordance with one aspect of the present disclosure.

FIG. 13 is a schematic cross sectional view showing an example of a configuration of silicon carbide semiconductor device 1000. A third electrode 43 is formed on silicon oxide film 35 by the CVD method, for example. Third electrode 43 functions as a gate electrode. Third electrode 43 may be made of polysilicon or the like having an impurity added thereto and having electrical conductivity, for example.

An interlayer insulating film 36 is formed by the CVD method, for example. Interlayer insulating film 36 may be formed of silicon dioxide or the like, for example. Interlayer insulating film 36 is formed to cover third electrode 43 and come into contact with silicon oxide film 35.

Next, silicon oxide film 35 and interlayer insulating film 36 at predetermined positions are removed by etching. Thereby, source region 32 and contact region 33 are exposed from silicon oxide film 35. At the exposed portion, a first electrode 41 is formed by a sputtering method, for example. First electrode 41 functions as a source electrode. First electrode 41 may contain titanium (Ti), aluminum, silicon, nickel (Ni), or the like, for example. After first electrode 41 is formed, first electrode 41 and second silicon carbide epitaxial substrate 101 are heat treated at a temperature of about 900 to 1100° C., for example. Thereby, first electrode 41 and second silicon carbide epitaxial substrate 101 come into ohmic contact with each other.

Next, an interconnection layer 37 is formed to come into contact with first electrode 41. Interconnection layer 37 may be made of aluminum or the like, for example.

Furthermore, a second electrode 42 in contact with second main surface 92 is formed. Second electrode 42 functions as a drain electrode. Second electrode 42 may be made of an alloy containing nickel and silicon (for example, NiSi or the like), for example.

Thereafter, second silicon carbide epitaxial substrate 101 is divided into a plurality of chips using a predetermined dicing blade. Thus, silicon carbide semiconductor device 1000 shown in FIG. 13 is completed.

[Fourth Embodiment: Silicon Carbide Semiconductor Device]

Next, silicon carbide semiconductor device 1000 in accordance with the present embodiment will be described. Silicon carbide semiconductor device 1000 shown in FIG. 13 is a vertical type MOSFET having a so-called planar structure. In the present embodiment, the chip size, that is, the effective area of the MOSFET which includes a cross sectional structure portion shown in FIG. 13 as a unit cell structure, is about 1 $mm^2$ to 100 $mm^2$, for example.

Silicon carbide semiconductor device 1000 includes second silicon carbide epitaxial substrate 101 including silicon carbide single crystal substrate 10 and epitaxial layer 13, silicon carbide single crystal substrate 10 having first main surface 91 and second main surface 92 located opposite to first main surface 91, epitaxial layer 13 being formed on first main surface 91 and having third main surface 93 opposite to a side on which silicon carbide single crystal substrate 10 is located.

Silicon carbide semiconductor device 1000 further includes silicon oxide film 35 formed on third main surface 93, first electrode 41 connected to a third main surface 93 side, and second electrode 42 connected to a second main surface 92 side.

The thickness of silicon oxide film 35 is more than or equal to 10 nm and less than or equal to 100 nm. Third electrode 43 is formed on silicon oxide film 35.

Epitaxial layer 13 includes drift region 30, body region 31, source region 32, contact region 33, and JFE region 34.

Body region 31, including a first body region 311 and a second body region 312, has a first conductivity type. The first conductivity type is p type, for example. Body region 31 is in contact with silicon oxide film 35 at third main surface 93. The impurity concentration in body region 31 may be more than or equal to about $1 \times 10^{16}$ $cm^{-3}$ and less than or equal to about $1 \times 10^{18}$ $cm^{-3}$, for example.

Source region 32 is provided within body region 31. Source region 32 is in contact with first electrode 41. The source region has a second conductivity type. The second conductivity type is a conductivity type different from the first conductivity type. For example, when the first conductivity type is p type, the second conductivity type is n type. The impurity concentration in source region 32 may be about $5 \times 10^{19}$ $cm^{-3}$, for example.

Contact region 33 is provided within body region 31. Contact region 33 is in contact with first electrode 41. The contact region has the first conductivity type. The impurity concentration in contact region 33 may be about $1 \times 10^{20}$ $cm^{-3}$, for example.

Drift region 30 has the second conductivity type. The impurity concentration in drift region 30 may be more than or equal to $1\times10^{14}$ cm$^{-3}$ and less than or equal to $1\times10^{16}$ cm$^{-3}$, for example.

JFET region 34 has the second conductivity type. JFET region 34 is sandwiched between first body region 311 and second body region 312. JFET region 34 is also sandwiched between silicon oxide film 35 and drift region 30 in a direction perpendicular to third main surface 93. The impurity concentration in JFET region 34 may be more than or equal to $1\times10^{14}$ cm$^{-3}$ and less than or equal to $1\times10^{16}$ cm$^{-3}$, for example.

Here, an operation of silicon carbide semiconductor device 1000 will be described.

In silicon carbide semiconductor device 1000, an OFF state is a state where the voltage of third electrode 43 (gate electrode) is less than a threshold value. In the OFF state, a pn junction between JFET region 34 and body region 31 located directly below silicon oxide film 35 (gate insulating film) is reverse-biased, and a non-conducting state is maintained. An ON state is a state where a voltage more than or equal to the threshold value is applied to third electrode 43. In the ON state, source region 32 and JFET region 34 are electrically connected with each other, and a current flows between first electrode 41 (source electrode) and second electrode 42 (drain electrode).

As described in the second embodiment, epitaxial layer 13 has excellent surface properties. Accordingly, improvement in the life and reliability of silicon oxide film 35 formed on epitaxial layer 13 can be expected.

The life and reliability of silicon oxide film 35 are evaluated by constant current TDDB. It can be said that, as a $Q_{BD}$ in the constant current TDDB increases, silicon oxide film 35 has a longer life. In silicon carbide semiconductor device 1000, the $Q_{BD}$ in the constant current TDDB performed in an environment at 25° C. and at 20 mA/cm$^2$ is more than or equal to 60 C/cm$^2$. Thereby, a stable operation can be expected even under a severe environment, such as with a large current passing therethrough, at a high temperature, or the like. The $Q_{BD}$ may be more than or equal to 70 C/cm$^2$, or more than or equal to 80 C/cm$^2$. Taking productivity into consideration, the upper limit of the $Q_{BD}$ may be 200 C/cm$^2$, for example.

[Evaluation]

[Constant Current TDDB Measurement]

Next, constant current TDDB measurement results in silicon carbide semiconductor device 1000 in accordance with the present embodiment will be described.

Silicon carbide epitaxial substrates in accordance with samples 1 to 3 were manufactured as follows. Samples 1 to 3 had a diameter of 150 mm. In sample 1, 15.5 μm-thick first layer 11 was homoepitaxially grown, and then 0.5 μm thereof at an outermost surface was converted into second layer 12. Second layer 12 was formed by stopping supply of the Si source gas, then adjusting the ratio of the flow rate of the C source gas to the flow rate of the carrier gas (H$_2$ gas) to 0.08% and increasing the substrate temperature by 30° C. On this occasion, the flow rates of the respective gases were adjusted in about 8 seconds. Thus, second layer 12 having a chemical composition different from that of first layer 11 was formed. The composition ratio of carbon in second layer 12 was higher than the composition ratio of carbon in first layer 11. Second layer 12 was polished by CMP. The polishing amount was set to 0.5 μm.

In samples 2 and 3, a 15 μm-thick epitaxial layer was grown. In samples 2 and 3, the second layer was not formed, and CMP was not performed. Other than those, manufacturing conditions in samples 2 and 3 were the same as manufacturing conditions in sample 1.

Surface properties of samples 1 to 3 were evaluated as described above. Table 1 shows results.

TABLE 1

| | Arithmetic Average Roughness (Ra) nm | Defect Density of Carrot Defects defects/cm$^2$ | Defect Density of Trapezoidal Defects defects/cm$^2$ |
|---|---|---|---|
| Sample 1 | 0.08 | 0 | 0.1 |
| Sample 2 | 0.2 | 0.4 | 0.5 |
| Sample 3 | 0.3 | 0.8 | 0.8 |

From sample 1, 22 chips, which were MOSFETs, were manufactured. Similarly, from each of samples 2 and 3, 22 chips were manufactured.

Figure 14:
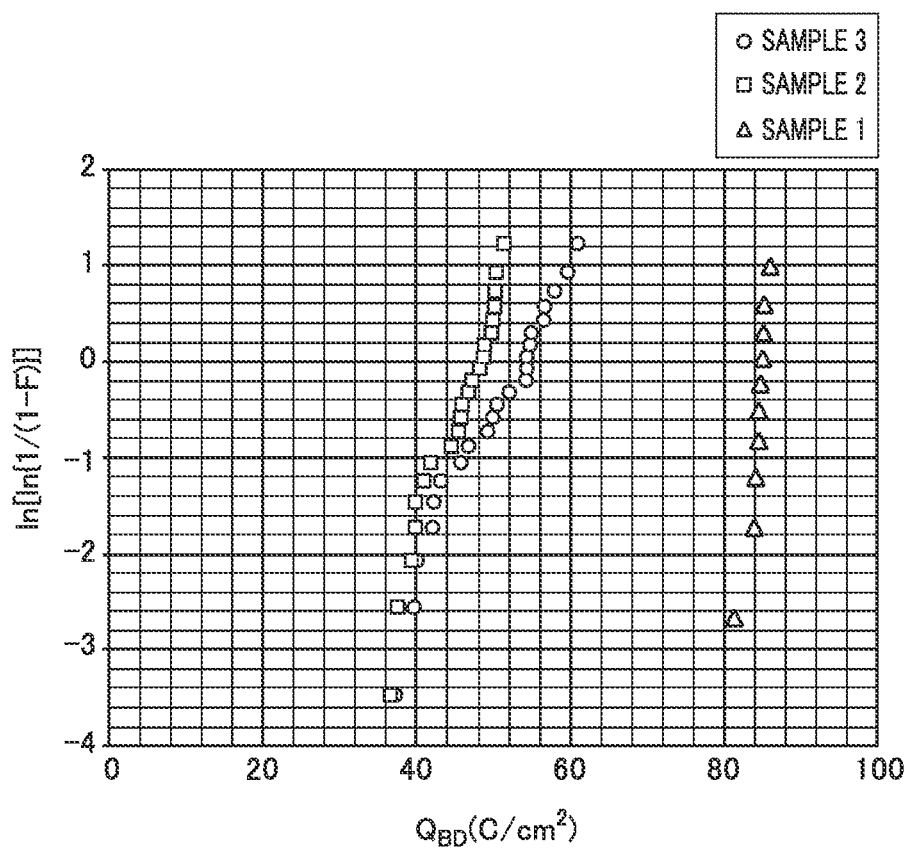
FIG. 14 is a Weibull plot showing constant current TDDB measurement results.

Constant current TDDB measurement was performed in an environment at 25° C. and at a constant current density of 20 mA/cm$^2$. FIG. 14 shows results. FIG. 14 is a Weibull plot showing constant current TDDB measurement results. In FIG. 14, the axis of ordinates represents the cumulative failure rate plotted on Weibull probability paper, and the axis of abscissas represents charge-to-breakdown ($Q_{BD}$). FIG. 14 shows that, as the $Q_{BD}$ increases, the silicon oxide film has a longer life, and, as the inclination of a plot group is closer to vertical, the silicon oxide film has a higher reliability. In FIG. 14, the triangular legends indicate sample 1, the square legends indicate sample 2, and the circular legends indicate sample 3.

As can be seen from FIG. 14, sample 1 in accordance with the present embodiment has a $Q_{BD}$ of more than or equal to 80 C/cm$^2$. In addition, the plot group of sample 1 is close to vertical, and thus sample 1 can be evaluated as having a high reliability.

It should be understood that the embodiments disclosed herein are illustrative and non-restrictive in every respect. The scope of the present invention is defined by the scope of the claims, rather than the embodiments described above, and is intended to include any modifications within the scope and meaning equivalent to the scope of the claims.

REFERENCE SIGNS LIST

1: film forming device; 2: chamber; 3: induction heating coil; 4: quartz tube; 5: heat insulator; 6: heating element; 7: curved portion; 8: flat portion; 10: silicon carbide single crystal substrate; 11: first layer; 12: second layer; 13: epitaxial layer; 20: trapezoidal defect; 21: upper base portion; 22: lower base portion; 23: origin; 24: protruding portion; 25: step bunching; 30: drift region; 31: body region; 311: first body region; 312: second body region; 32: source region; 33: contact region; 34: JFET region; 35: silicon oxide film; 36: interlayer insulating film; 37: interconnection layer; 41: first electrode; 42: second electrode; 43: third electrode; 91: first main surface; 92: second main surface; 93: third main surface; 100: first silicon carbide epitaxial substrate; 101: second silicon carbide epitaxial substrate; 1000: silicon carbide semiconductor device.

The invention claimed is:

1. A silicon carbide epitaxial substrate, comprising:
a silicon carbide single crystal substrate; and
an epitaxial layer formed on the silicon carbide single crystal substrate;
an arithmetic average roughness in a surface of the epitaxial layer being less than or equal to 0.1 nm, in the surface, carrot defects having a defect density of less than or equal to 0.1/cm², trapezoidal defects, which are trapezoidal depressions, having a defect density of less than or equal to 0.1/cm², the trapezoidal defects each including an upper base portion and a lower base portion intersecting with a <11-20> direction when viewed in plan view, the upper base portion having a width of more than or equal to 0.1 μm and less than or equal to 100 μm, and the lower base portion having a width of more than or equal to 50 μm and less than or equal to 5000 μm, the upper base portion including a protruding portion, and the lower base portion including a plurality of step bunchings.

2. A method for manufacturing a silicon carbide semiconductor device, comprising:

preparing the silicon carbide epitaxial substrate according to claim 1; and forming a silicon oxide film on the epitaxial layer.

3. The silicon carbide epitaxial substrate according to claim 1, wherein the silicon carbide single crystal substrate has a diameter of more than or equal to 150 mm and less than or equal to 300 mm.

4. The silicon carbide epitaxial substrate according to claim 1, wherein the silicon carbide single crystal substrate has a main surface inclined from a (0001) plane or a (000-1) plane by more than or equal to 1° and less than or equal to 8°, and the epitaxial layer formed on the main surface.

5. The silicon carbide epitaxial substrate according to claim 1, wherein the defect density of the carrot defects is more than zero.

6. The silicon carbide epitaxial substrate according to claim 1, wherein the defect density of the trapezoidal defects is more than zero.

* * * * *